US009214416B1

(12) United States Patent
Furnival

(10) Patent No.: US 9,214,416 B1
(45) Date of Patent: Dec. 15, 2015

(54) HIGH SPEED, LOW LOSS AND HIGH DENSITY POWER SEMICONDUCTOR PACKAGES (μMAXPAK) WITH MOLDED SURFACE MOUNT HIGH SPEED DEVICE(S) AND MULTI-CHIP ARCHITECTURES

(71) Applicant: Courtney Furnival, Lake Arrowhead, CA (US)

(72) Inventor: Courtney Furnival, Lake Arrowhead, CA (US)

( * ) Notice: Subject to any disclaimer, the term of this patent is extended or adjusted under 35 U.S.C. 154(b) by 0 days.

(21) Appl. No.: 14/299,207

(22) Filed: Jun. 9, 2014

Related U.S. Application Data

(60) Provisional application No. 61/838,265, filed on Jun. 22, 2013.

(51) Int. Cl.
H01L 23/48 (2006.01)
H01L 23/495 (2006.01)

(52) U.S. Cl.
CPC .... *H01L 23/49541* (2013.01); *H01L 23/49568* (2013.01)

(58) Field of Classification Search
CPC ..... H01L 24/05; H01L 2224/04; H01L 23/04; H01L 23/49575; H01L 24/03; H01L 2924/1461
USPC .......................... 257/659, 676, 763, 774, 777
See application file for complete search history.

(56) References Cited

U.S. PATENT DOCUMENTS

2014/0367865 A1* 12/2014 Powell .................... H01L 24/05
257/777

* cited by examiner

Primary Examiner — Dung A Le

(57) ABSTRACT

A new Power DFN and Power QFN package architecture that accommodates Bump-chip die and other components in cavities on the bottom-side of the matrix leadframe, and the technique is also applicable to laminated substrate packages like the BGA and LGA.
The package is especially suited for high speed power compound semiconductor devices like GaN and SiC. The package enables single and multiple power switch configurations, and well controlled paralleling of high speed power die switches. It enables co-packaging of associated components like cascoded switchs, gate drivers, isolators and protection devices, which must be tightly coupled at high switching speeds.
The architecture accommodates components on the top-side of the leadframe as well allowing for multi-chip functions with extremely low interconnect inductance and resistance, and higher circuit and power densities.
The package architecture provides for lower package thermal resistance with parallel thermal paths from both sides of power die to the external bottom-side pads, and supplementary isolated and non-isolated top-side heat dissipation.
These type packages use standard proven, reliable and cost effective materials & assembly techniques that are available at commercial contract assemblers. They minimizes NRE for special equipment, tooling and development, and reduces time to market.

3 Claims, 8 Drawing Sheets

Power QFN, Standard Type with FET Switch and Gate Drive IC, Top X-ray View

Power QFN, Standard Type with FET Switch and Gate Drive IC, Cross-section View

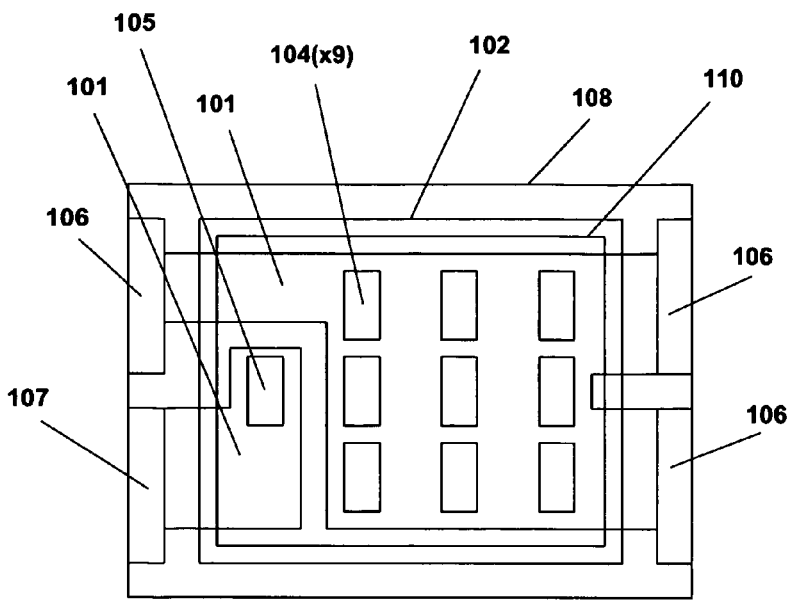
FIGURE 1a: Power DFN, Standard Type with FET Switch, Top X-ray View
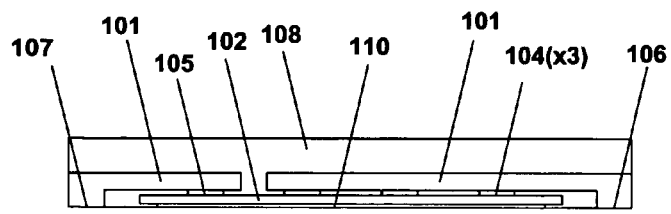
FIGURE 1b: Power DFN, Standard Type with FET Switch, Cross-Section View
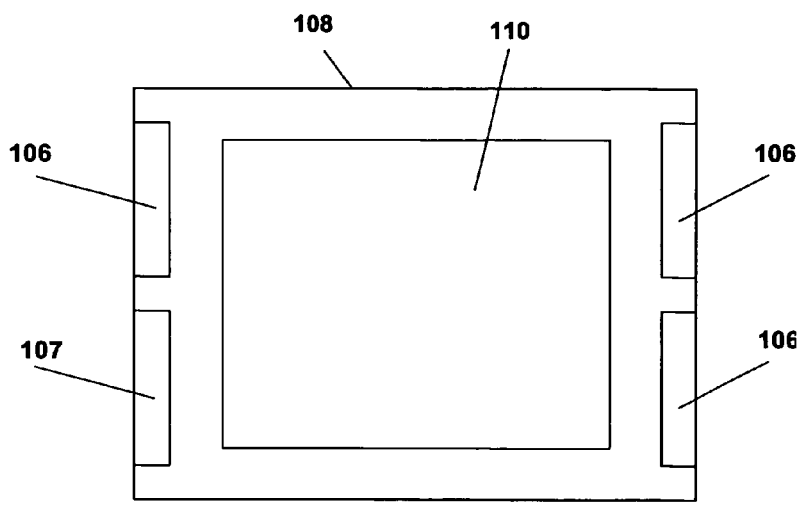
FIGURE 1c: Power DFN, Standard Type with FET Switch, Bottom View

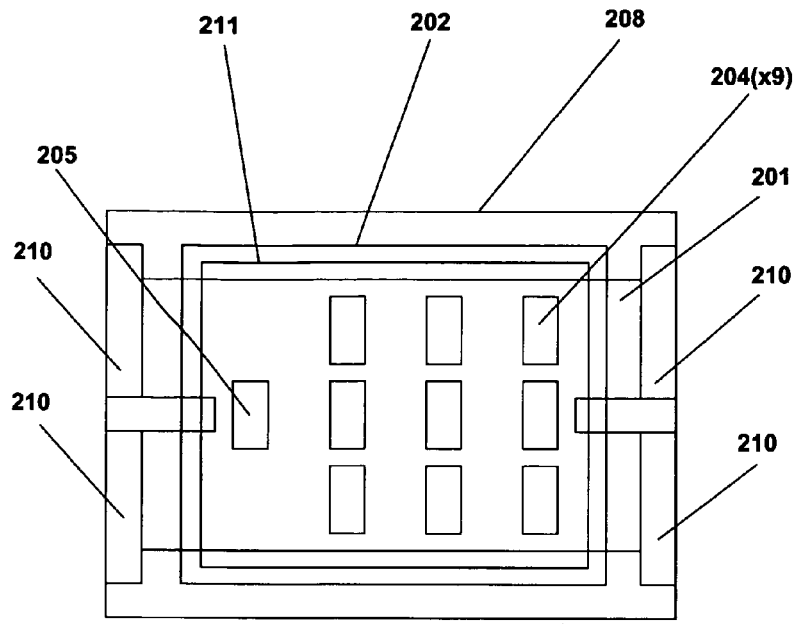
FIGURE 2a: Power DFN, Inverted Type with FET Switch, Top X-ray View
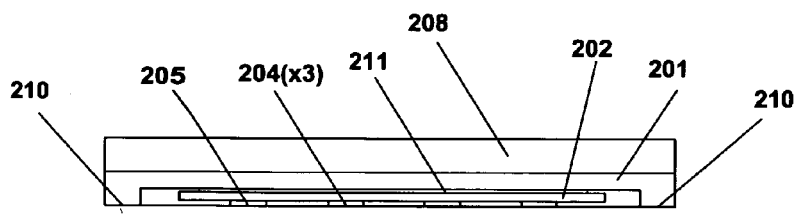
FIGURE 2b: Power DFN, Inverted Type with FET Switch, Cross-Section View
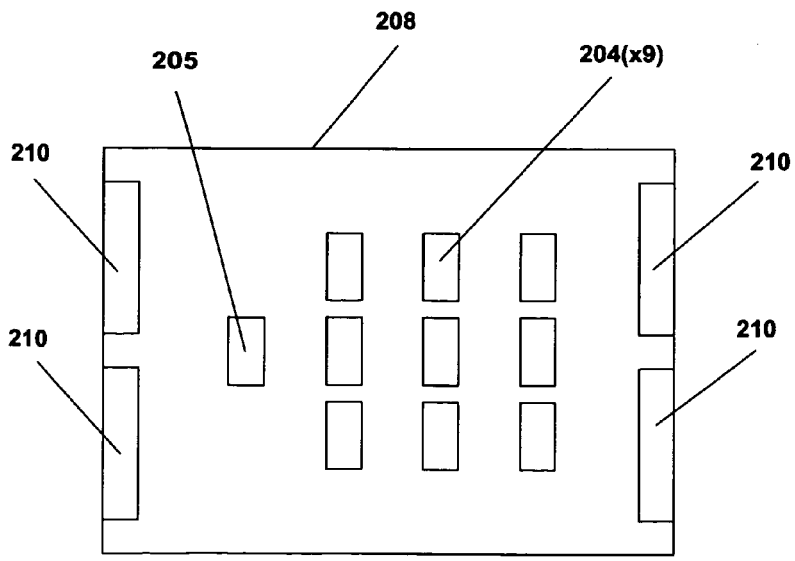
FIGURE 2c: Power DFN, Inverted Type with FET Switch, Bottom View

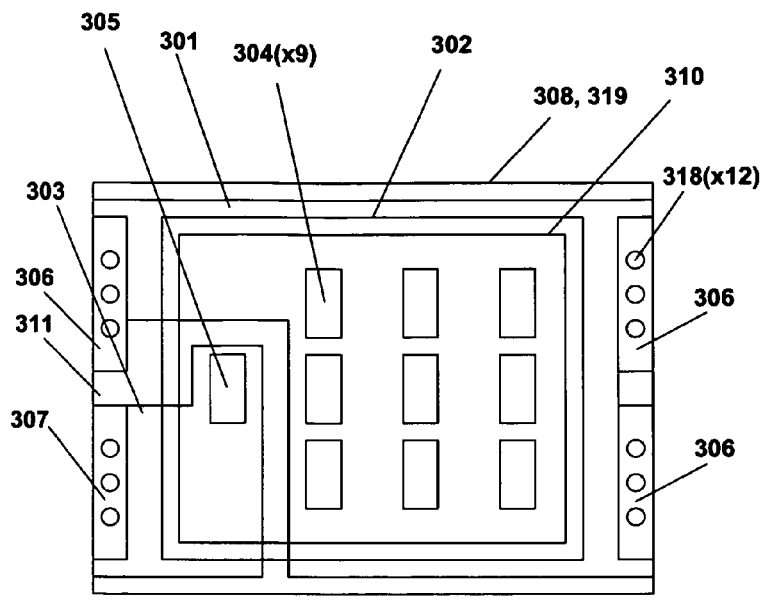
FIGURE 3a: Power LGA, Standard Type with FET Switch, Top X-ray View
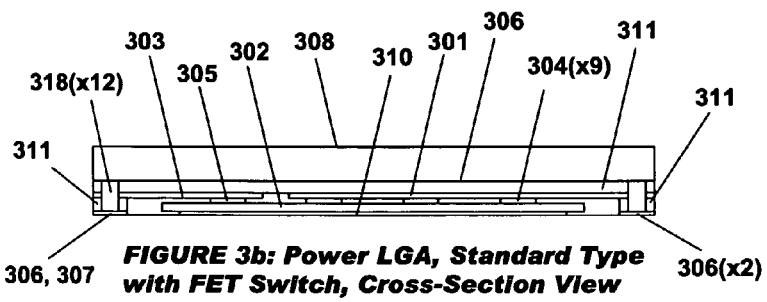
FIGURE 3b: Power LGA, Standard Type with FET Switch, Cross-Section View
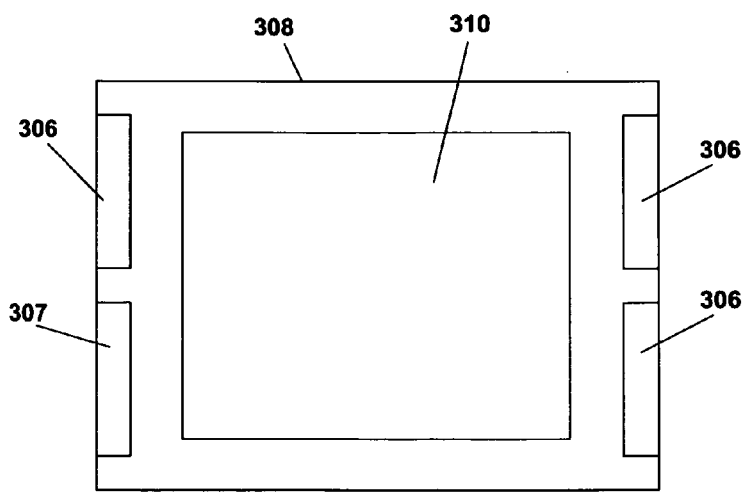
FIGURE 3c: Power LGA, Standard Type with FET Switch, Bottom View

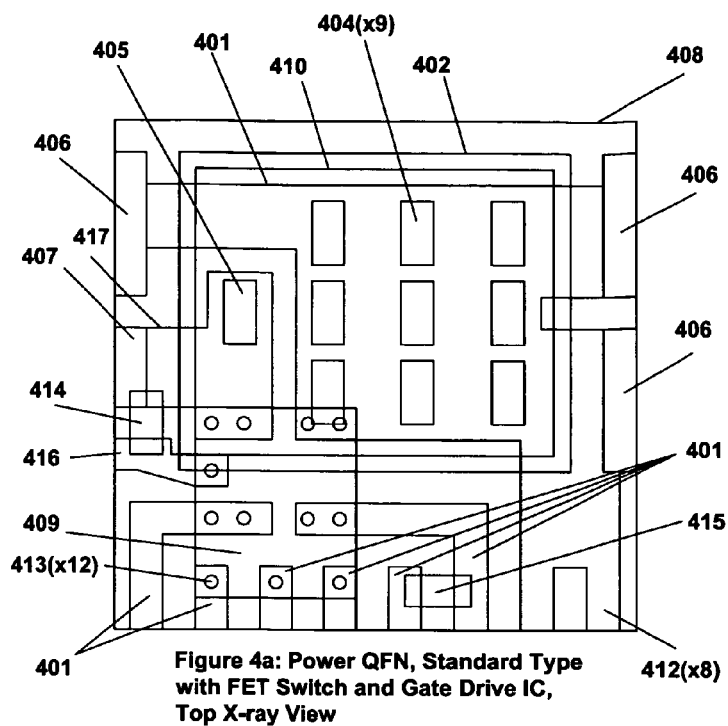
Figure 4a: Power QFN, Standard Type with FET Switch and Gate Drive IC, Top X-ray View
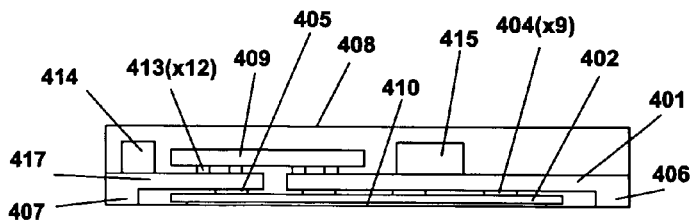
Figure 4b: Power QFN, Standard Type with FET Switch and Gate Drive IC, Cross-section View
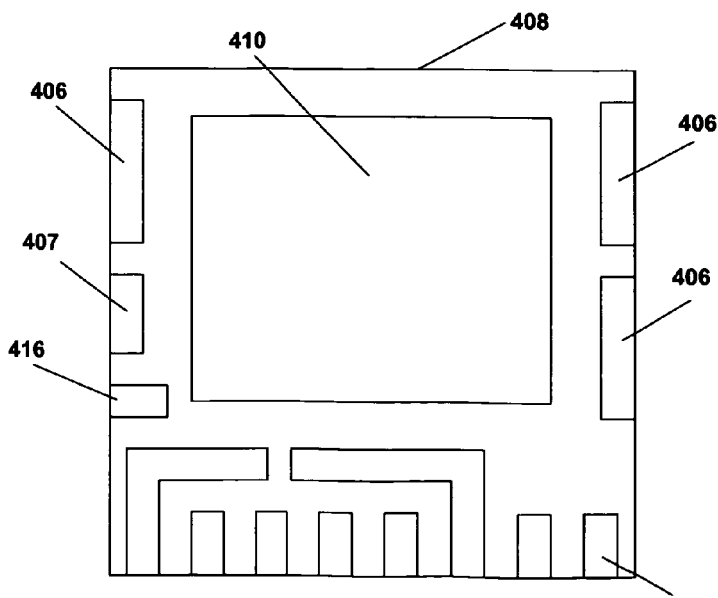
Figure 4c: Power QFN, Standard Type with FET Switch and Gate Drive IC, Bottom View

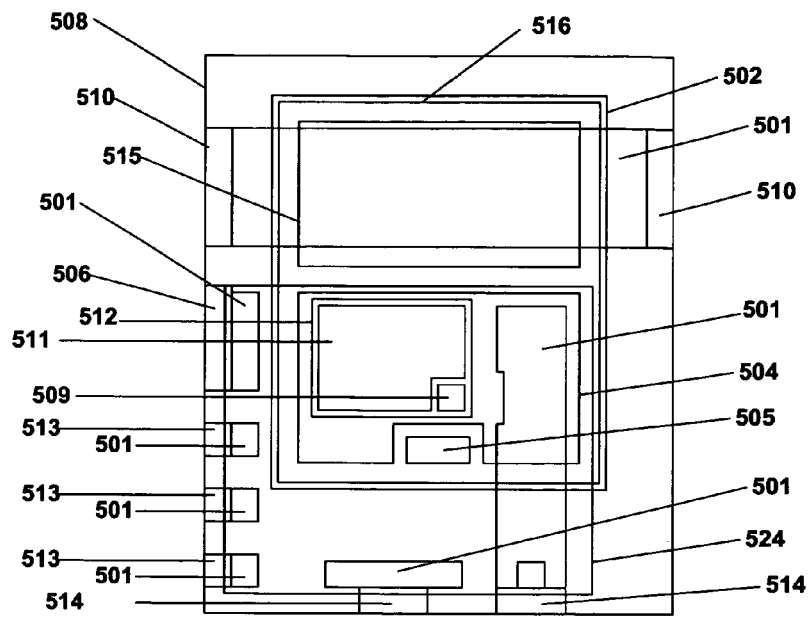
Figure 5a: Power QFN, Standard Type with GaN Switch, Cascode FET and Gate Drive IC, Top X-ray View
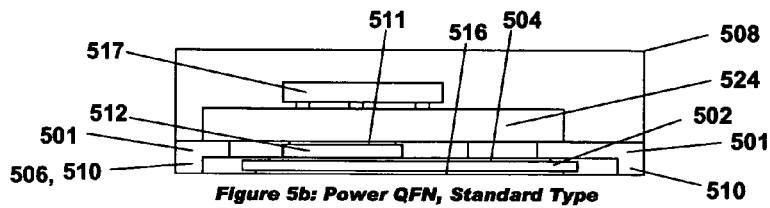
Figure 5b: Power QFN, Standard Type with GaN Switch, Cascode FET & Gate Drive IC, Cross-Section View
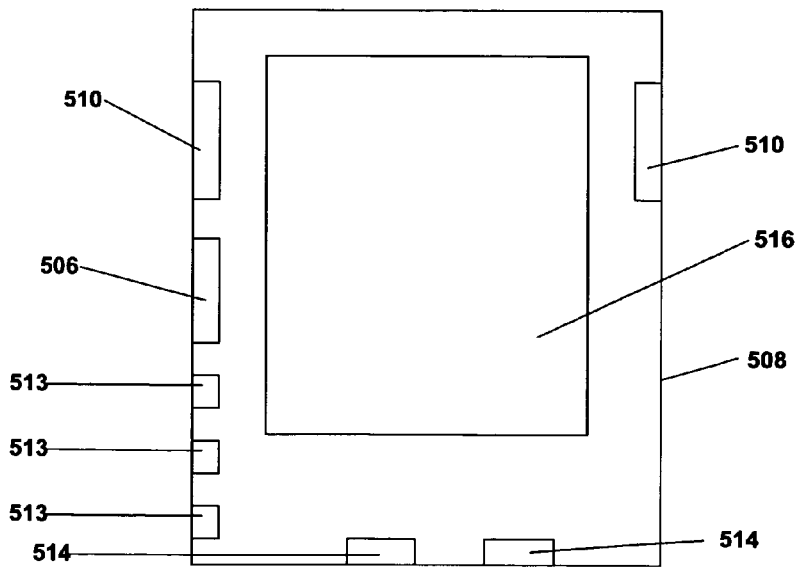
Figure 5c: Power QFN, Standard Type withGaN Switch, Cascode FET & Gate Drive IC, Bottom View

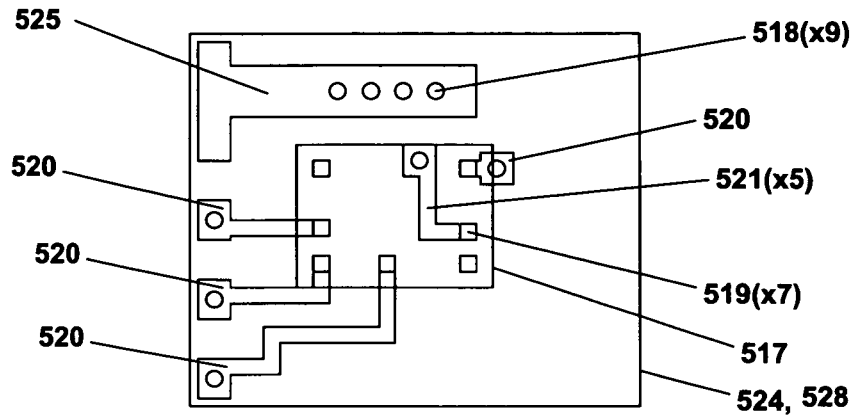
*Figure 5d: Gate Drive IC and PCB Chip-Carrier with Copper Traces, Via, Pads, and Gate Drive IC, Top View*
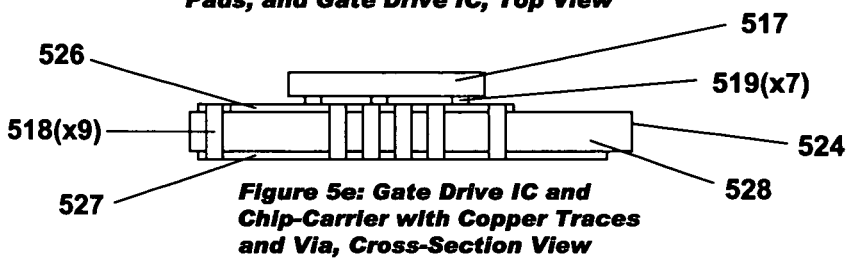
*Figure 5e: Gate Drive IC and Chip-Carrier with Copper Traces and Via, Cross-Section View*
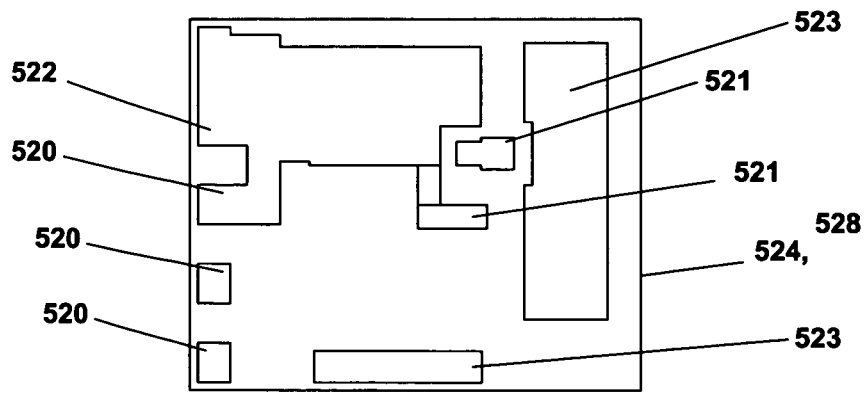
*Figure 5f: Chip-Carrier with Copper Traces and Pads, Chip-Carrier, Bottom View*

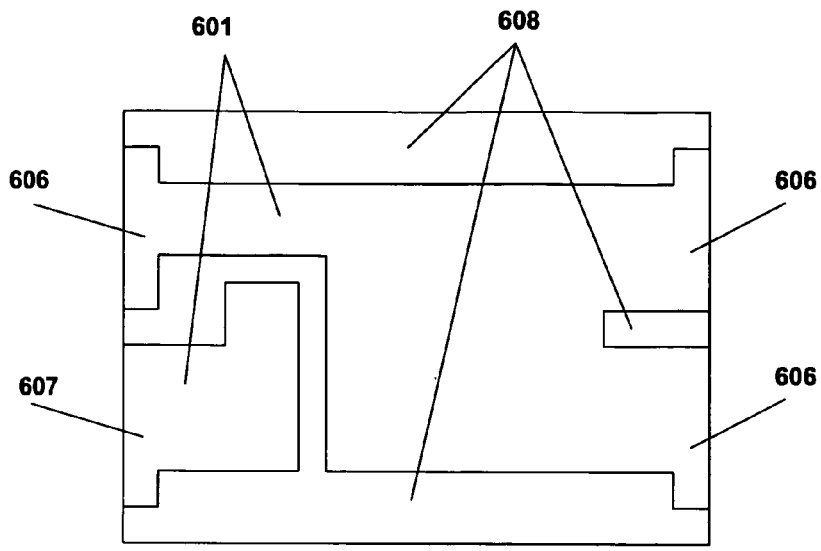
FIGURE 6a: Power DFN, Standard Thin Type with FET Switch, Top View
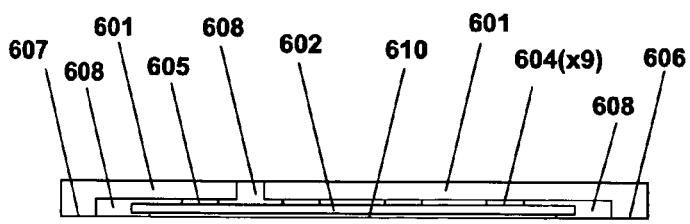
FIGURE 6b: Power DFN, Standard Thin Type with FET Switch, Cross-Section View
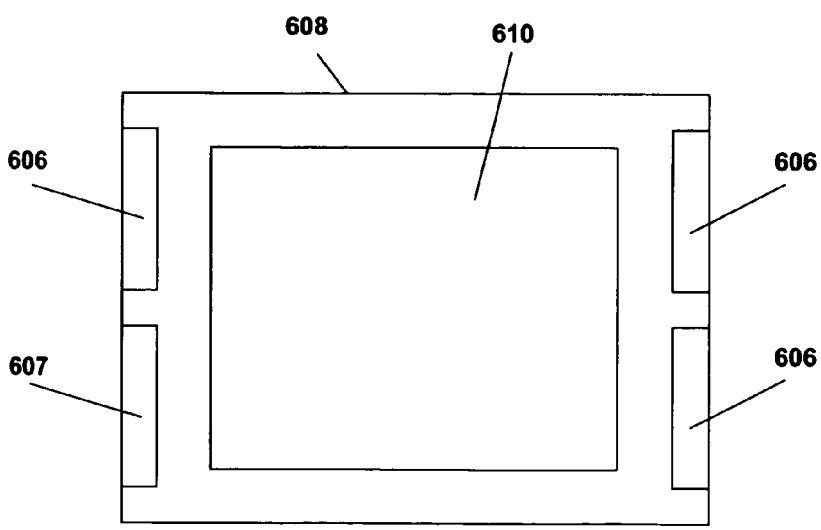
FIGURE 6c: Power DFN, Standard Thin Type with FET Switch, Bottom View

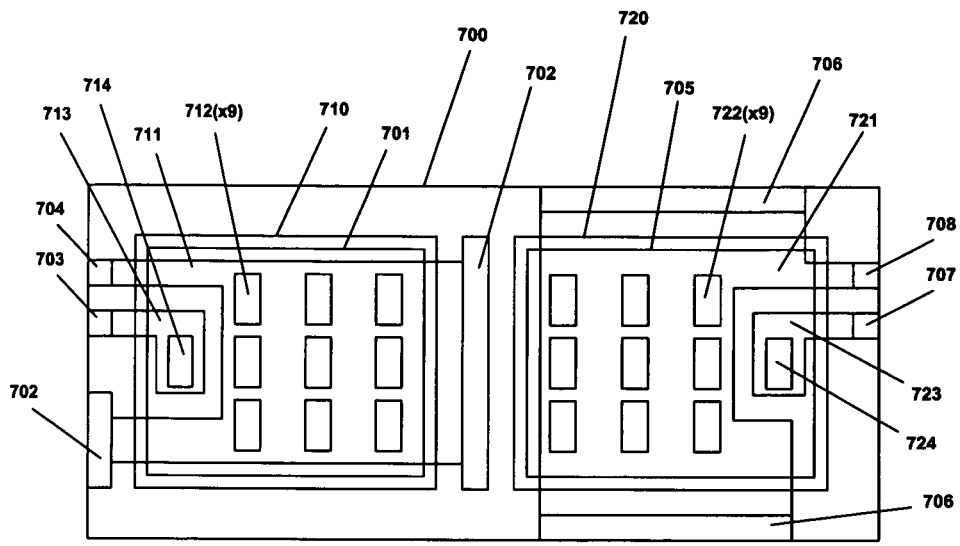
FIGURE 7a: Power QFN, Standard Type Half-Bridge with Two SiC Transistor Switches, Top X-ray View
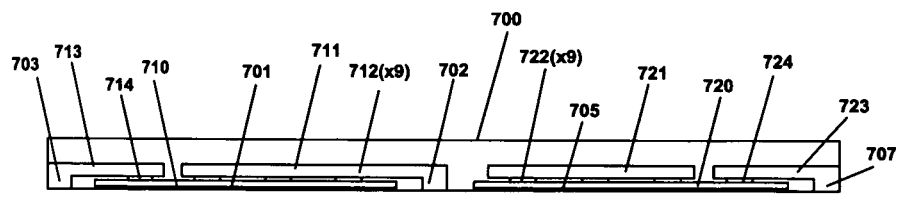
FIGURE 7b: Power QFN, Standard Type Half-Bridge with Two SiC Transistor Switches, Cross-Section View
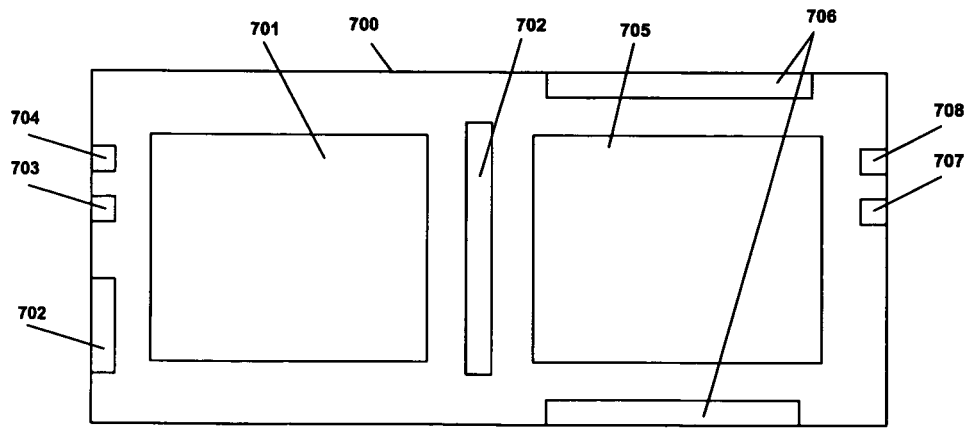
FIGURE 7c: Power QFN, Standard Type Half-Bridge, Bottom View

HIGH SPEED, LOW LOSS AND HIGH DENSITY POWER SEMICONDUCTOR PACKAGES (µMAXPAK) WITH MOLDED SURFACE MOUNT HIGH SPEED DEVICE(S) AND MULTI-CHIP ARCHITECTURES

CROSS-REFERENCES TO RELATED APPLICATIONS

This application claims the benefits of U.S. Provisional Application No. 61/838,265, filed Jun. 22, 2013, which is incorporated herein by reference in its entirety for all purposes.

BACKGROUND OF THE INVENTION

Power Electronic products are being required to provide higher circuit and power density, and to operate at higher and higher frequencies. This has created a trend toward more integration, higher circuit and power density, and more complete "systems-in-package" (SiP). Ideal packaging is at the semiconductor and component level. Semiconductor packages are typically assembled using highly automated manufacturing. Semiconductor packages are typically low cost with proven performance and reliability. Innovative package architecture can capitalize on proven package technologies and manufacturing infrastructure to create high power products and to increase operating frequencies, efficiencies and power densities. These improvements can enable lower package resistance, inductance, power dissipation and circuit density, and are often applicable to both high power and lower signal level devices.

BRIEF SUMMARY OF THE INVENTION

This invention is a new type of package architecture or structure, which builds upon leadless surface mount packages like the DFN (Dual Leadframe No-Lead) and QFN (Quad Leadframe No-Lead) packages. These innovative architectures have been named the "µMaxPak", because of the potential small size and maximum performance. These packages are typically block-molded on matrix leadframes and sawed into individual units after assembly, but these new architectures are not limited to group or matrix construction. The new architecture is also applicable to substrate or printed circuit board (PCB) based packages like the BGA (Ball Grid Array) and LGA (Land Grid Array) packages. Typically the leadframe packages provide the highest performance, and the substrate packages accommodate higher complexities with more layers and more complex interconnects. The new architectures are applicable to other and less common surface mount packages, which can accommodate a bottom-side cavity or cavities.

The new package architectures provide for assembly of semiconductor devices and components in a cavity on the bottom side of a leadframe or substrate, and can accommodate semiconductor devices and components on the top side of the leadframe or substrate within the same package. They can accommodate multiple devices and components on either or both sides on the leadframe, or PCB substrate with suitable bottom side cavity.

The bottom side assembly of devices and/or components is surface mounted within the leadframe cavity or up-set area, or within the substrate or PCB cavity. The cavity or up-set can be etched, stamped, punched or milled, but etching is most common for leadframe based packages like the DFN and QFN, and punching and milling are most common for pre-laminated PCB based packages, like the BGA and LGA. The cavity or cavities are best suited for thin semiconductor die that can be soldered or glued or otherwise attached into the cavity to make exceptionally effective mechanical, thermal and electrical connections to the leadframe, or to the PCB substrate.

Thin semiconductor bump-chip (Flip-chip) die with metalized contact pads on both top and bottom sides are ideal for the package leadframe or substrate structures, and are ideal for electrical and thermal performance, providing excellent contact to the leadframe or substrate, and create bottom side external contact pads to the package. The technique is not limited to bump-chip die, and is applicable to any sufficiently thin device or component with suitable contact pads. The top-side devices and components can accommodate bump-chips and passive chip components, which are small and leadless, but the top side can also accommodate chip & wire and other types of small standard components.

In the Standard Type configurations, the die are assembled into the bottom leadframe cavity with the bump-side to the leadframe pads and the back of the die exposed at the bottom of the package as shown in FIGS. 1a, 1b and 1c. In general, the top of the die is the side with multiple pads, but the innovative architecture is applicable to multiple pads on either side or both.

In the Inverted Type configuration the back of the die is assembled is into the leadframe with the back of the die to the leadframe and the bump-side exposed at the bottom of the package as shown in FIGS. 2a, 2b and 2c.

A Standard Type LGA configuration is shown in FIGS. 3a, 3b and 3c.

The choice between Standard and Inverted Type configurations depends on specific product and package requirements like voltage, thermal resistance, interconnects, size and special components. An example of leadframe Standard Type with gate driver integrated circuit (IC) is shown in FIGS. 4a, 4b and 4c.

Standard Type configuration with internal vertical integration can further enhance device power density, speed and efficiency. A stacked cascoded power switch with PCB chip-carrier above containing a gate driver IC is shown in FIGS. 5a, 5b and 5c with chip-carrier detail in FIGS. 5d, 5e and 5f. Cascoded switches are often used with normally-on high speed devices like GaN and SiC power switches. The extremely fast and efficient power GaN and SiC switches demand the performance created by these innovative architecture.

This invention enables power switches with extremely low interconnect inductance and resistance, which is ideal for high speed power FETs or MOSFETs (Metal Oxide Field Effect Transistors) and IGBTs (Insulated Gate Bipolar Transistors). These packages are even more effective with power compound semiconductor devices like GaN and SiC, which offer higher efficiencies and power densities at higher operating frequencies. These Type package architectures are important for such devices to achieve their optimum performance.

BRIEF DESCRIPTION OF THE DRAWINGS

FIG. 1a shows an X-ray view of the Power DFN Standard Type embodiment with power FET die drain pads exposed on the bottom of the DFN package, and the external source and gate pads on the bottom of the package connected through the leadframe to the die source and gate pads inside the bottom-side cavity.

FIG. 1b shows a cross-section of the Power DFN leadframe Standard Type embodiment, and direct external drain connection on the exposed die, and the short wide source and gate paths to external package pads, which together provide the exceptionally low thermal resistance, electrical resistance and inductance.

FIG. 1c shows the bottom external pads of the Power DFN package Standard Type embodiment.

FIG. 2a shows an X-ray view of a Power DFN Inverted Type embodiment with power FET die source and gate pads exposed on the bottom of the DFN package, and the external drain pads connected through the leadframe to the die drain pad inside the bottom-side cavity.

FIG. 2b shows a cross-section of the Power DFN Inverted Type embodiment, with the direct die source and drain pad at the bottom of the package, and the short wide drain paths to external package pads, which together provide the exceptionally low thermal resistance, electrical resistance and inductance.

FIG. 2c shows the bottom external pads of the Power DFN package Inverted Type embodiment.

FIG. 3a shows an X-ray view of a Power LGA substrate Standard Type embodiment with power FET die drain pads exposed on the bottom of the LGA package, and the external source and gate pads connected through the substrate copper foil and via to the die source and gate pads inside the bottom-side substrate cavity.

FIG. 3b shows a cross-section of the Power LGA PCB Standard Type embodiment, an the direct external die drain pad, and the short wide source and gate paths to external package pads, which together provide the exceptionally low thermal resistance, electrical resistance and inductance.

FIG. 3c shows the bottom external pads of the Power LGA Standard Type embodiment.

FIG. 4a shows an X-ray view of a Power QFN Standard Type embodiment with power FET die drain exposed on the bottom of the Power QFN package, with the external source and gate pads connected through the leadframe to the source and gate die pads inside the bottom-side leadframe cavity, and gate drive (GD) integrated circuit bump-chip die contacts attached to the top of the leadframe directly above the power FET die.

FIG. 4b shows a cross-section of the Power QFN Standard embodiment, and the direct external FET die drain pad, and the short source and gate paths to external package pads, which together provide the exceptionally low thermal resistance, electrical resistance and inductance, and the virtually zero length connection between GD output and FET gate with virtually zero connection inductance.

FIG. 4c shows the bottom external pads of the Power QFN Standard Type embodiment with integrated gate drive.

FIG. 5a shows an X-ray view of a Power QFN Standard Type embodiment, and the power GaN die drain pad exposed on the bottom of the Power QFN package, and the external source and gate pads connected through the leadframe to the GaN die source and gate pads inside the bottom-side leadframe cavity. The normally-on GaN is kept normally-off with a series FET die in the cascoded configuration soldered directly on the GaN die source pad. A PCB chip-carrier (CC) with bump-chip IC is soldered on top the leadframe and cascode FET source and drain pads, and the CC provides the additional cascode and GD interconnects.

FIG. 5b shows a cross-section of the Power QFN Standard Type embodiment, direct external GaN die drain pad, and the short wide source and gate paths to external package pads and cascode pads, which provide the exceptionally low thermal resistance, electrical resistance and inductance, and the virtually zero length connection between GD output, FET gate and GaN die gate near zero connection inductance.

FIG. 5c shows the bottom external pads of the Power QFN Standard Type embodiment with integrated cascoded GaN switch and GD.

FIG. 5d show the top side of the chip-carrier with copper traces, via and GD bump-chip IC FIG. 5e shows the cross-section of the chip-carrier and GD IC die with copper traces, via and bumps.

FIG. 5f shows bottom copper traces and pads, and via of the chip-carrier.

FIG. 6a shows the top view of a Power DFN Thin Standard Type embodiment with a power FET, which allows supplementary heatsinks to be attached to the top of the package with an external or internal isolation layer. The power FET die drain pad is exposed on the bottom of the DFN package, and the external source and gate pads on the bottom of the package are connected through the leadframe to the die source and gate pads inside the bottom-side of the cavity.

FIG. 6b shows a cross-section view of a Power DFN Thin Standard Type embodiment, and exposed leadframe on the top-side for heatsink attachment, and direct drain connection on the exposed bottom-side die, and the short wide leadframe paths to the external bottom-side leadframe package pads, which together provide the exceptionally low thermal resistance, electrical resistance and inductance.

FIG. 6c shows the bottom external pads of the Power DFN package Thin Standard embodiment.

FIG. 7a shows an X-ray view of a Power QFN multi-chip multi-switch Standard Type embodiment with two SiC transistor switches in a Half-bridge (HB) configuration. The power drain of both SiC transistors die are exposed on the bottom of the package, as well as the source and gate of each. In the HB configuration, the high-side SiC transistor drain is the positive supply, the low-side SiC transistor source is the negative supply, and the common high-side source and low side drain are the output. There are also pads for gate and source sense for both the high-side and low-side switches.

FIG. 7b shows a cross-section view of the Power QFN HB embodiment, and the exposed drain pads of both bottom-side SiC transistors die, and the short wide leadframe source, sense and gate paths to the external bottom-side leadframe package pads, which together provide the exceptionally low thermal resistance, electrical resistance and inductance.

FIG. 7c shows the bottom external pads of the Power QFN HB package Thin Standard embodiment.

DETAILED DESCRIPTION OF THE DRAWINGS

FIGS. 1a, 1b and 1c provide an example of an 8 mm×6 mm×1 mm power DFN with a 6 mm×5 mm power MOSFET die. This embodiment demonstrates a high voltage power single-switch in the Standard Type leadframe configuration of the invention.

FIG. 1a shows an X-ray view of the package, and the outline of the package body (108) with DFN leadframe (101) and a MOSFET die (102) soldered into the bottom of the leadframe (101) cavity at the die source (S) pads (104) and die gate pad (105). The leadframe connects the die source pads (104) to the package source pads (106), and the die gate pad (105) to the package gate pad (107). An array of package leadframes is over-molded, and the molded array is sawed or otherwise singulated, into individual packages with individual leadframes. The outside of the package is defined by the molded surface (108), and all internal spaces are filled with that molding compound. The package mechanical, electrical and thermal connections are made to the package source pads (104), package gate pad (105) and drain pad (110).

FIG. 1b shows a cross-section of the package (108), and the primary heat dissipation path from the MOSFET die (102) is directly from the drain pad (110) on the bottom of the die, which is geometrically ideal with zero connection length and maximum contact surface area. The zero length and maximum area is geometrically ideal for minimizing the drain inductance. The secondary heat paths originate from the source pads (104) and gate pad (105) on the top of the die, providing the shortest and widest path from the top die pads (104, 105) through the leadframe to the package pads (106, 107). The minimum length and maximum width also minimizes internal lateral leadframe (101) inductance.

FIG. 1c shows the external pads on the bottom of the surface mount Power DFN package (108) including three source pads (106), gate pad (107) and drain pad (110).

FIGS. 2a, 2b and 2c provide an example of another 8 mm×6 mm×1 mm Power DFN with a 6 mm×5 mm power MOSFET die. This embodiment demonstrates a power single-switch in the Inverted Type leadframe configuration of the invention.

FIG. 2a show an X-ray view of the package, and the outline of the molded body (208) with DFN leadframe (201) and a MOSFET die (202) soldered or glued, or otherwise attached, into the leadframe cavity at the die drain pad (211). Further, the leadframe (201) connects the die drain pad (211) to the four package drain pads (210), which provide a low inductance and low resistance to the drain connection. An array of package leadframes (201) is over-molded, and the array is sawed or otherwise singulated, into individual packages (208). The outside of the package is defined by the molded surface (208), and all internal spaces are filled with that molding compound. The multiple source pads (204) and a gate pad (205) on the FET die (202) are exposed on the bottom of the package.

FIG. 2b shows a cross-section of the package (208), and the primary thermal conduction path from the MOSFET die (202) originates directly from the source pads (204) and the gate pad (205) on the bottom of the die, providing geometrically ideal zero connection length and maximum contact surface area. The zero length and maximum area provides an ideal geometry that minimizes the package source and gate inductance and resistance. The secondary thermal conduction path originates from the die drain pad (211) on the die through the leadframe (201) to the four external package drain pads (210), and providing the shortest and widest path from the top die drain pad to the drain package pads. The minimum length and maximum width provides minimum leadframe inductance and resistance.

FIG. 2c shows the external pads on the bottom of the surface mount Power DFN package (208) including multiple source pads (204), a gate pad (205) and four drain pad (210).

FIGS. 3a, 3b and 3c provide an example of an 8 mm×6 mm 1 mm Power LGA with a 6 mm×5 mm power MOSFET die. This embodiment demonstrates another power single-switch in the Standard Type configuration of the invention, where the leadframe is replaced with a PCB substrate.

FIG. 3a show an X-ray view of the package, and the outline of the molded package body (308) with LGA PCB substrate outline (319), and a MOSFET die (302) soldered into the bottom of the substrate cavity at the multiple die source pads (304), and die gate pad (305). The substrate copper foil (301) and via (318) connects the multiple die source pads (304) to the three package source external pads (306), and the substrate copper foil (303) and via (318) connect the die gate pad (305) to the package gate external pad (307). An array of package substrates is over-molded, and the array is sawed or otherwise singulated, into individual packages (308). The outside of the package is defined by the molded surfaces (308), and all internal spaces are filled with that molding compound. The exposed die drain pad (310) on the bottom of the package is also shown.

FIG. 3b shows a cross-section of the package (308), and the primary heat dissipation path from the MOSFET drain pad (310) on the bottom of the die (302), which is geometrically ideal with zero length connection and maximum contact surface area. The zero length and maximum area is geometrically ideal for minimizing the drain connection inductance and resistance. The secondary heat dissipation paths originate from the source pads (304) and gate pad (305) on the top of the die (302), and provides the shortest and widest path through the wide copper foil (301), and through the multiple via (318) that go through the dielectric layer (311) to the external source package pads (306), and through the wide copper foil (303) and via (318) to the external gate package pad (307). The copper foil traces pads (306, 307) are on the bottom surface of the LGA PCB substrate, and the copper plated via (318) make electrical and thermal connections between the bottom copper pad layer (306, 307) and the upper copper foil trace (301, 303) layer. The minimum length and maximum width of copper trace (301, 303) minimize the package inductance and resistance.

FIG. 3c shows the external pads on the bottom of the surface mount Power LGA package (308) including three source pads (306), gate pad (307) and the drain pad (310).

FIGS. 4a, 4b and 4c provide an example of an 8 mm×6 mm×1 mm Power QFN with a 6 mm×5 mm power MOSFET die, gate drive IC die and chip capacitor. This embodiment demonstrates a power single-switch and gate driver in the Standard Type leadframe configuration of the invention with integrated bump-chip gate drive IC soldered on top the leadframe, and the GD output pad above the MOSFET gate pad.

FIG. 4a shows an X-ray view of the package with the outline of the QFN package body (408) with QFN leadframe (401) and a MOSFET die (402) soldered into the bottom of the leadframe (401) cavity at multiple die source pads (404) and the die gate pad (405). The leadframe (401) connects the nine die source pads (404) to the three package external source pads (406), and the leadframe (417) connects the die gate pad (405) to the package external gate pad (407). The gate drive bump-chip die (409) is soldered to the top of the leadframe (401, 417) by twelve solder bumps (413), and two of the bumps are above the MOSFET gate pad (405) on leadframe (417). Ten gate drive input bumps (413) are connected to the eight package input pads (412). There are associated chip-capacitors (414, 415) solder on top of leadframe pads (407, 412, 416). An array of package leadframes is over-molded, and the array is sawed or otherwise singulated, into individual packages (408). The outside of the package is defined by the molded surface (408), and all internal spaces are filled with that molding compound. The package mechanical, electrical and thermal connections are made to the package source pads (406), package gate pad (407) and drain pad (410). As with the Standard and Inverted Type single-switches, this embodiment of the invention minimizes all the package interconnects thermal resistance, electrical resistance and inductance are all minimized.

FIG. 4b shows a cross-section of the package (408) with a bump-chip gate driver IC (409) on the leadframe (401, 417) above the MOSFET gate pad (405) region, proving virtually zero GD output to MOSFET FET gate inductance. Associated passive chip components (414, 415) are also attached to the top-side of the leadframe. The primary heat dissipation path from the MOSFET die (402) originates from the drain pad (410) on the bottom of the die, providing a geometrically ideal zero connector length and maximum contact surface area. The zero length and maximum area also minimizes the drain inductance and resistance. The secondary heat dissipation paths are from the source pads (404) and gate pad (405) on the top of the die, and provides the shortest and widest path from the top die pads (404, 405) through the leadframe (401, 417) to the external package pads (406,407). The minimum length and maximum width also minimizes internal leadframe inductance and resistance. The two gate drive output solder bumps, a subset of solder bumps (413) over the MOFET gate pad (405) provide a near zero path length minimizing the GD output to MOSFET gate connection inductance and resistance. No-connect (N/C) pad (416) is for support on internal interconnect portion of the leadframe and chip component (414).

FIG. 4c shows the external package pads on the bottom of the surface mount Power QFN package (408) including three source pads (406), gate pad (407), drain pad (410), N/C pad (416) and eight input pads (412).

FIGS. 5a, 5b, 5c, 5d, 5e and 5f provide an example of an 8.5 mm×7.0 mm 2.0 mm Power QFN with a 6 mm×5 mm power GaN or SiC die, MOSFET cascode die, and an integrated gate drive IC die on a PCB chip-carrier. This embodiment demonstrates a power cascoded single-switch and stacked gate driver integrated into the Standard Type configuration of the invention.

FIG. 5a shows an X-ray view of the package, and the outline of the package body (508) with QFN leadframe (501) and a lateral power GaN die (502) soldered to the bottom of the leadframe (501) cavity at the die drain pads (515), the die source pad (504), and at chip-carrier (524) input and support pads. The leadframe is soldered to the GaN die drain pad (515) and source pad (504), connecting the GaN drain pad (515) to package external pads (510) and the GaN die source pad to the package external source pad (506) and support N/C pad (514). The cascode MOSFET die (512) is soldered to the GaN die source pad (504) at the MOSFET drain pad on the bottom of the MOSFET die (512). A PCB chip-carrier (524) with gate drive IC die and any passive components is solder to the top of the leadframe (501), and to the top of the MOSFET die at the MOSFET source pad (511) and gate pad (509). The chip-carrier copper traces connect the MOSFET source pad (511) to the GaN gate pad (505), and the MOSFET gate pad (509) to the output of the gate drive IC bump (not shown in FIG. 5a). Chip-carrier and gate drive and connection details are shown in FIGS. 5d, 5e and 5f. The array of package assembled leadframes is over-molded, and the array is sawed or otherwise singulated, into individual packages (508) with individual leadframes (501). The outside of the package is defined by the molded surface (508), and all internal spaces are filled with that molding compound. The primary package mechanical and thermal connections are made through the GaN backside package N/C pad (516), and secondary support and thermal connections are made through the GaN drain pads (510), source pad (506), N/C pads (512) and the input pads (513). As with the Standard and Inverted Type single-switches, the package thermal resistance, electrical resistance and inductance are all minimized.

FIG. 5b shows the package (508) cross-section, and the primary heat dissipation path is from the GaN die (502) through the isolated or N/C pad (516) on the bottom of the GaN die (502), which is ideal with minimum thickness and maximum contact surface area. The secondary heat dissipation paths are through the leadframe (501) from GaN drain pad (515) to external package pads (510), and from GaN die source pad (504) to external N/C pads (514), and through MOSFET source pad (511) to external source pad (506). The minimum length and maximum width also minimizes internal leadframe inductance.

FIG. 5c shows the external package pads on the bottom of the surface mount Power QFN package (508) including the large isolated thermal pad (516), two drain pads (510), one source pad (506), input pads (513) and N/C support pads (514).

FIGS. 5d, 5e and 5f provides details of the laminate PCB chip-carrier with gate drive IC within the molded Power QFN with GaN die and MOSFET cascode die, and shows how the vertical or stacked structures with multi-chip functions enable complex integration or co-packaging configurations in the invention.

FIG. 5d shows a top view of the laminate chip-carrier (524) and laminate dielectric core (528) with traces (521), pads (520, 525), nine via (518) and bump-chip gate drive IC die (517) with seven solder bumps (519). Copper traces (521) connect gate driver solder bumps to external chip-carrier pads (520), and trace (522) connects the cascode MOSFET source to the Power QFN external thermal pad, and provides additional support at pad (525).

Figure 5e show a cross-section that shows the chip-carrier (524) on laminate core (528). The gate drive bump-chip die (517) is soldered to the top-side interconnect copper foil layer (526) by multiple solder bumps (519). Multiple via (518) make electrical and thermal connections between the top copper layer (526) and bottom copper layer (527). The simplified layer (526) represents all chip-carrier top-side (520, 521, 525), and the simplified layer (527) represents all the chip-carrier bottom side pads (520, 521, 522, 523, FIG. 5f show the bottom-side of the chip carrier (524) on laminate (528) with copper IC input pads (520), and low inductance trace (522) to external Power QFN pad 506, and mechanical support and thermal connector pads (523).

FIGS. 6a, 6b and 6c provide an example of an 8 mm×8 mm×0.5 mm Power DFN with 5 mm×5 mm power MOSFET die. This embodiment demonstrates a high voltage power single switch in the Standard Thin Type leadframe configuration of the invention. The die is vertical construction, but lateral construction die can be accommodated with the configurations of the invention.

FIG. 6a shows a top view of the package (608) with molded body areas (608) and exposed top of the leadframe (601) above the bottom-side source pads (606) and gate pad (607). The exposed leadframe (601) provides a contact for attachment of supplementary top-side heatsink, which can significantly reduce the thermal resistance of the package. The external heatsink can be isolated from the exposed leadframe (601) by an external isolator or a thin thermal isolator in the top surface of the package (608). Potential internal isolator layers can include a thin molding compound layers, prepreg or other laminated layer, of cooper with isolation layer, and any attached material that provides isolation, heat transfer and interface for external heatsink. All other structures and features of the Thin Standard Type package are identical to those of the Standard Type package shown in FIG. 1a.

FIG. 6b shows a cross-section of the package (608), and the exposed top-side leadframe (601) creating the mounting surface for the external heatsink, and the low thermal resistance from the FET die (602) to externally isolated heatsink. It shows the bottom-side electrical and thermal external package drain pad (610), source pads (606) and gate pad (607). The Thin Standard package Type can be half the thickness of the Standard Type package shown in FIG. 1b, and all other the structures and features are identical. This Thin Type package provides strong internal vertical support, and can support strong clamping forces created from top and bottom heatsinks, cold plates or other mechanical components.

FIG. 6c show the bottom view of the Thin Standard Type package (608), which is identical to the Standard Type package shown in FIG. 1c.

FIGS. 7a, 7b and 7c provide an example of a 16 mm×7 mm Power QFN Half-Bridge with two 6 mm×5 mm SiC transistor die. This embodiment demonstrates a high voltage power half-bridge in a Standard Type leadframe configuration of the invention.

FIG. 7a shows an X-ray view of a half-bridge or two switch package, and the molded body (700) with QFN leadframe (711, 713, 721, 723). The two FET die (710, 720) are soldered, glued or otherwise attached into the two leadframe (711, 713, 721, 723) formed cavities. The leadfame (711) connects FET (710) die source multiple pads (712) to the external output pads (702, 704), and the gate pad (714) to the external high-side gate pad (703), and connects FET (720) die source multiple pads (722) to external negative supply pads (706, 708), and the gate pad (724) to external low-side gate pad (707). Furthermore, the FET (710) drain pad (701) is exposed on the bottom of the package and functions as the external positive supply pad (701), and the FET (720) drain pad (705) is exposed on the bottom of the package and functions as output pad (705), and output pads (702, 705) are attached externally in typical half-bridges application. The half-bridge Standard Type package provided all the features of the standard single-switch embodiment in FIG. 1, plus total loop-inductance is further reduced by connecting the two switches inside a single HB package.

FIG. 7b show a cross section of the half-bridge package (700) with two Standard Type switches each having the same structure and features as the individual Standard Type single-switch shown in FIG. 1b. The leadframe (711) connects FET (710) die source multiple pads (712) to the external output pads (703) and gate pad (714) to the external high-side gate pad (703), and connects FET (720) die source multiple pads (722) to external negative supply pads (706) and gate pad (724) to external low-side gate pad (707). Furthermore, the FET (710) drain pad (701) is exposed on the bottom of the package and functions as the external positive supply pad (701), and FET (720) drain pad (705) is exposed on the bottom of the package and functions as output pad (705), and output pads (702, 705) are attached externally in typical half-bridges application.

FIG. 7c shows the external pads on the bottom of the surface mount HB Power QFN package (700) including positive supply pad (701), negative supply pads (706), output pads (702, 705), high-side gate pad (703) with high-side S-sense pad (704) and low-side gate pad (707) with low-side S-sense pad (708).

Note, FIGS. 1a, 2a, 3a, 4a, 4c, 5a, and 7a are viewed Top-X-ray views through the package to better show the vertical placement and interconnections as in an overlay. The FIGS. 1b, 2b, 3b, 4b, 5b, 5e, 6b and 7b are cross-sections that show key features, and not at a single specific location.

DRAWINGS LIST

FIG. 1a: Power DFN, Standard Type with FET Switch, Top X-ray View
FIG. 1b: Power DFN, Standard Type with FET Switch, Cross-section View
FIG. 1c Power DFN, Standard Type with FET Switch, Package Bottom Pads
FIG. 2a: Power DFN, Inverted Type with FET Switch, Top X-ray View
FIG. 2b: Power DFN, Inverted Type with FET Switch, Cross-section View
FIG. 2c: Power DFN, Inverted Type with FET Switch, Bottom View
FIG. 3a: Power LGA, Standard Type with FET Switch, Top X-ray View
FIG. 3b: Power LGA, Standard Type with FET Switch, Cross-section View
FIG. 3c: Power LGA, Standard Type with FET Switch, Bottom View
FIG. 4a: Power QFN, Standard Type with FET Switch and Gate Drive IC, Top X-ray View
FIG. 4b: Power QFN, Standard Type with FET Switch and Gate Drive IC, Cross-section View
FIG. 4c: Power QFN, Standard Type with FET Switch and Gate Drive IC, Bottom View
FIG. 5a: Power QFN, Standard Type with HEMT Switch, Cascode FET and Gate Drive IC, Top X-ray View
FIG. 5b: Power QFN, Standard Type with HEMT Switch, Cascode FET and Gate Drive IC, Cross-section View
FIG. 5c: Power QFN, Standard Type with HEMT Switch, Cascode FET and Gate Drive IC, Bottom View
FIG. 5d: Gate Drive IC, PCB Chip-Carrier with Copper Traces, Via, Pads and Gate Drive IC, Top View
FIG. 5e: Gate Drive IC and Chip-Carrier with Copper Traces and Via, Cross-Section View
FIG. 5f: Chip-Carrier with Copper Traces and Pads, Bottom View
FIG. 6a: Power DFN, Standard Thin Type with FET Switch, Top View
FIG. 6b: Power DIN, Standard Thin Type with FET Switch, Cross-Section View
FIG. 6c: Power DFN, Standard Thin Type with FET Switch, Bottom View
FIG. 7a: Power QFN, Standard Type Half-bridge with Two SiC Transistor Switches, Top X-ray View
FIG. 7b: Power QFN, Standard Type Half-bridge with Two SiC Transistor Switches, Cross-Section View
FIG. 7c: Power QFN, Standard Type Half-bridge, Bottom View

What is claimed is:
1. A semiconductor package structure comprising:
molded leadless surface mount package architecture with leadframe or laminate bottom-side sub-structures;
open cavity(s) in the bottom of leadframe or laminate sub-structures;
die attached into the open cavity(s) making mechanical, electrical & thermal contact to leadframe or laminate pad areas;
space on top-side of sub-structure that can accommodate additional die and components forming a double sided sub-structure;
over-molded top-side of sub-structure, top-side die and components, and open spaces within leadframe or laminate sub-structures; and
pads on bottom-side of die and leadframe or laminate sub-structures are exposed on the bottom-side of the molded leadless surface mount package after over-mold creating external pads for mechanical, electrical and thermal connection to a mounting surface or mother-board.

2. The package of claim 1 wherein bump-chip die and surface mount components provide direct electrical and thermal paths from die and components to the external pads providing very low electrical resistance, thermal resistance and inductance paths to the external pads.

3. The package of claim 1 wherein the architecture can be assembled with techniques for molded-leadless packages like leadframe DFN and QFN packages and like laminate BGA and LGA packages.

* * * * *